US011258193B2

(12) United States Patent
Kitajima

(10) Patent No.: US 11,258,193 B2
(45) Date of Patent: Feb. 22, 2022

(54) BOARD CONNECTOR AND METHOD FOR MANUFACTURING HOUSING OF BOARD CONNECTOR

(71) Applicant: Sumitomo Wiring Systems, Ltd., Mie (JP)

(72) Inventor: Mitsunori Kitajima, Mie (JP)

(73) Assignee: Sumitom Wiring Systems, Ltd., Yokkaichi (JP)

(*) Notice: Subject to any disclaimer, the term of this patent is extended or adjusted under 35 U.S.C. 154(b) by 169 days.

(21) Appl. No.: 16/667,042

(22) Filed: Oct. 29, 2019

(65) Prior Publication Data

US 2020/0136285 A1 Apr. 30, 2020

(30) Foreign Application Priority Data

Oct. 30, 2018 (JP) ............................ JP2018-203633

(51) Int. Cl.

*H01R 12/00* (2006.01)
*H05K 1/00* (2006.01)
*H01R 12/71* (2011.01)
*H01R 12/57* (2011.01)
*H01R 43/18* (2006.01)
*H01R 13/50* (2006.01)

(52) U.S. Cl.

CPC ........... *H01R 12/716* (2013.01); *H01R 12/57* (2013.01); *H01R 13/50* (2013.01); *H01R 43/18* (2013.01)

(58) Field of Classification Search

CPC .......................... H01R 12/716; H01R 23/7073
See application file for complete search history.

(56) References Cited

U.S. PATENT DOCUMENTS

| | | | | |
|---|---|---|---|---|
| 6,244,909 | B1 * | 6/2001 | Okada | H01R 12/716 439/844 |
| 7,704,101 | B2 * | 4/2010 | Nagata | H01R 12/724 439/660 |
| 7,722,401 | B2 * | 5/2010 | Kirk | H01R 13/514 439/607.07 |
| 8,597,047 | B2 * | 12/2013 | Soubh | H01R 13/6477 439/485 |
| 8,876,538 | B2 * | 11/2014 | Shiraishi | H01R 13/516 439/79 |
| 9,793,647 | B2 * | 10/2017 | Suzuki | H01R 13/4538 |
| 9,960,533 | B2 * | 5/2018 | Kudo | H01R 13/6272 |

(Continued)

FOREIGN PATENT DOCUMENTS

JP 2018-032524 3/2018

*Primary Examiner* — Abdullah A Riyami
*Assistant Examiner* — Thang H Nguyen
(74) *Attorney, Agent, or Firm* — Gerald E. Hespos; Michael J. Porco; Matthew T. Hespos

(57) ABSTRACT

A board connector includes terminal fittings (60) including board connecting portions (62), and a housing (10) made of synthetic resin containing a fibrous filler (80), disposed on a circuit board (90) and including a wall (18) rising in a vertical direction intersecting a surface of the circuit board (90). The wall (18) has a terminal mounting region (21) in which the terminal fittings (60) are mounted. The wall (18) includes elongated recesses (31) with a longitudinal direction aligned with the vertical direction and arranged side by side in a width direction in a distant region (22) located on a side of the terminal mounting region (21) distant from the circuit board (90).

6 Claims, 6 Drawing Sheets

(56) References Cited

U.S. PATENT DOCUMENTS

| | | | | |
|---|---|---|---|---|
| 2008/0085616 | A1* | 4/2008 | Hirai | H05K 3/3426 439/83 |
| 2008/0146094 | A1* | 6/2008 | Shimizu | H01R 31/085 439/891 |
| 2021/0239500 | A1* | 8/2021 | Uenodan | G01F 1/684 |

* cited by examiner

BOARD CONNECTOR AND METHOD FOR MANUFACTURING HOUSING OF BOARD CONNECTOR

BACKGROUND

Field of the Invention

The invention relates to a board connector and a method for manufacturing a housing of a board connector.

Related Art

Japanese Unexamined Patent Publication No. 2018-32524 discloses a board connector with a housing and terminal fittings. The housing is a wide rectangular tube made of synthetic resin and is disposed on a surface of a circuit board. Insertion holes extend through a back wall of the housing. The terminal fittings have contact portions mounted through the respective insertion holes and board connecting portions to be connected to a circuit board.

The board connecting portion of each terminal fitting is connected by reflow soldering to a conductive portion on the surface of the circuit board. Heat generated during reflow soldering is transferred to the housing and may cause the resin of the housing to undergo a thermal expansion. Thus, the housing may curve and deform. A curved and deformed housing may cause terminal fittings mounted in the housing to displace away from the conductive portion, with an adverse effect on connection and mounting reliability.

The invention was completed on the basis of the above situation and aims to provide a board connector capable of ensuring a good connected state of terminal fittings to a circuit board by suppressing deformation of a housing.

SUMMARY

The invention is directed to a board connector with a housing and terminal fittings that have board connecting portions to be connected to a circuit board. The housing is made of synthetic resin containing a fibrous filler and is disposed on the circuit board. The housing includes a wall rising in a direction intersecting the surface of the circuit board and is provided with a terminal mounting region. The terminal fittings are mounted in the terminal mounting region of the wall. The wall has elongated recesses with a longitudinal direction of each recess aligned along a direction intersecting the surface of the circuit board. The recesses are arranged side by side in a transverse direction perpendicular to the longitudinal direction at least in a distant region, where the distant region is located on a side distant from the circuit board across the terminal mounting region and a near region is located on a side near the circuit board.

The fibrous filler is easy to expand in a longitudinal direction of fibers and hard to expand in a transverse direction under a heated environment. The housing is made of the synthetic resin containing the fibrous filler and has the elongated recesses aligned so that the longitudinal direction of the respective recess aligns with the direction intersecting the surface of the circuit board. Additionally, the recesses are arranged side by side in the transverse direction intersecting the longitudinal direction in the distant region of the wall. Thus, molten resin easily flows from the distant region to the near region in a direction toward the circuit board during the molding of the housing. As a result, the fibrous filler can be oriented such that a longitudinal direction thereof is aligned with the direction intersecting the surface of the circuit board so that the housing that is in a heated environment will hardly curve and deform in a direction along the surface of the circuit board, which is the transverse direction of the fibrous filler. By suppressing the deformation of the housing in this way, a good connected state of the board connecting portions of the terminal fittings to the circuit board can be maintained.

The housing may include a plate-like side wall projecting in a direction intersecting a surface of the back wall. The side wall is configured to cover exposed parts of the terminal fittings pulled out from the terminal mounting region, and a resin pouring portion left by removing a resin gate is provided in a surface of the side wall. According to this configuration, the molding of the housing can be carried out by pouring molten resin into a plate-like molding space for forming the side wall from the resin pouring portion and successively easily flows to respective molding spaces of the distant region and the near region from the plate-like molding space. As a result, a state where the longitudinal direction of the fibrous filler is aligned with the direction intersecting the surface of the circuit board is realized easily and deformation of the housing is suppressed more effectively.

The terminal mounting region includes terminal mounting holes in the longitudinal direction and the transverse direction of the recesses. A plurality of the terminal mounting holes arranged in the transverse direction of the recesses may be partitioned by mounting walls. The mounting walls may be arranged in stages in the longitudinal direction of the recesses. Additionally, the mounting walls may be thicker than intermediate walls located between the mounting walls in the respective stages in the longitudinal direction and include parts projecting toward openings of the recesses. The mounting wall arranged in the distant region may include a flat continuous surface in which the recesses are defined and both the terminal mounting holes and the recesses are open. According to this configuration, the mounting wall arranged in the distant region has a large dimension in the direction intersecting the surface of the circuit board and a thickness direction. Thus, the molten resin easily flows to the distant region, the longitudinal direction of the fibrous filler can be oriented from the distant region to the near region, and the deformation of the housing can be suppressed more effectively.

A method for manufacturing the housing of the board connector may be carried out such that the resin gate is arranged at a position corresponding to the resin pouring portion. Molten resin may be injected into a molding space of a mold from the resin gate, and the housing may be molded to include a filling path in which the molten resin successively flows in parts of the molding space respectively corresponding to the side wall, the distant region, the terminal mounting region and the near region. The molten resin flows in the filling path during the molding of the housing. Thus, the longitudinal direction of the fibrous filler can be oriented in the direction intersecting the surface of the circuit board, thereby molding a housing that will hardly curve and deform.

DETAILED DESCRIPTION

One embodiment of the invention is described using FIGS. 1 to 6. A board connector according to this embodiment is a surface-mount type connector to be mounted on a surface of a circuit board 90 and includes a housing 10 to be disposed on the surface of the circuit board 90 and terminal fittings 60 to be mounted into the housing 10. The housing 10 is connectable to mating housings of unillustrated mating connectors. Note that, in the following description, a right side of FIG. 4, which is a side facing the mating housings at the start of connection, is referred to as a front concerning a front-rear direction and a vertical direction is based on a vertical direction of each figure except FIG. 6. Further, a width direction is synonymous with a lateral direction of FIGS. 2 and 3.

Figure 6:
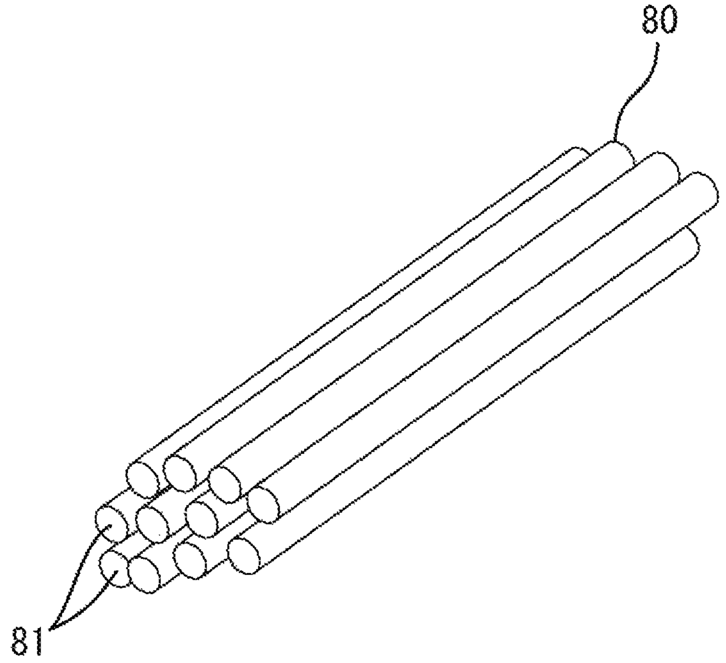
FIG. 6 is a schematic perspective view of a fibrous filler.

The housing 10 is made of synthetic resin and is molded by pouring (injecting) a resin material in a molten state (hereinafter, molten resin) containing a fibrous filler 80 into an unillustrated mold and cooling and curing the molten resin. The fibrous filler 80 is, for example, constituted by inorganic fibers, such as glass fibers. As shown in FIG. 6, a fiber length is significantly larger than a fiber width (fiber diameter) and many filaments 81 are bundled to extend in a given direction. Thus, the fibrous filler 80 can be oriented such that a longitudinal direction thereof is aligned with a flowing direction of the molten resin when the housing 10 is molded. The housing 10 has an increased mechanical strength by the reinforcing action of the fibrous filler 80.

Figure 3:
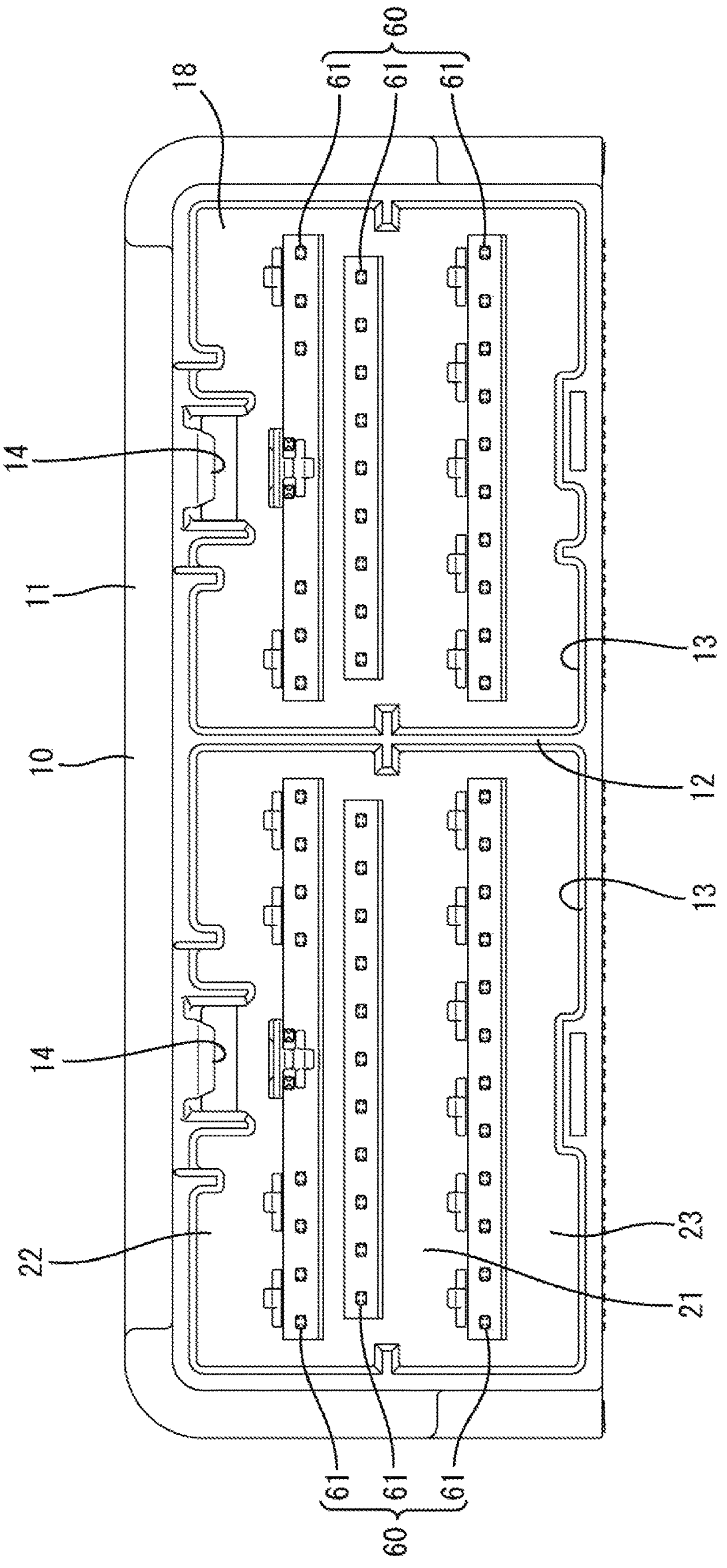
FIG. 3 is a front view of the board connector.

The housing 10 is a wide rectangular tube and includes a forwardly open receptacle 11, as shown in FIG. 3. A vertically extending separation wall 12 divides the receptacle 11 into two fitting spaces 13, and the mating housings are fit respectively into the fitting spaces 13. Locks 14 are provided on upper wall inner surfaces of both fitting spaces 13 to hold the mating housings in a connected state.

Figure 1:
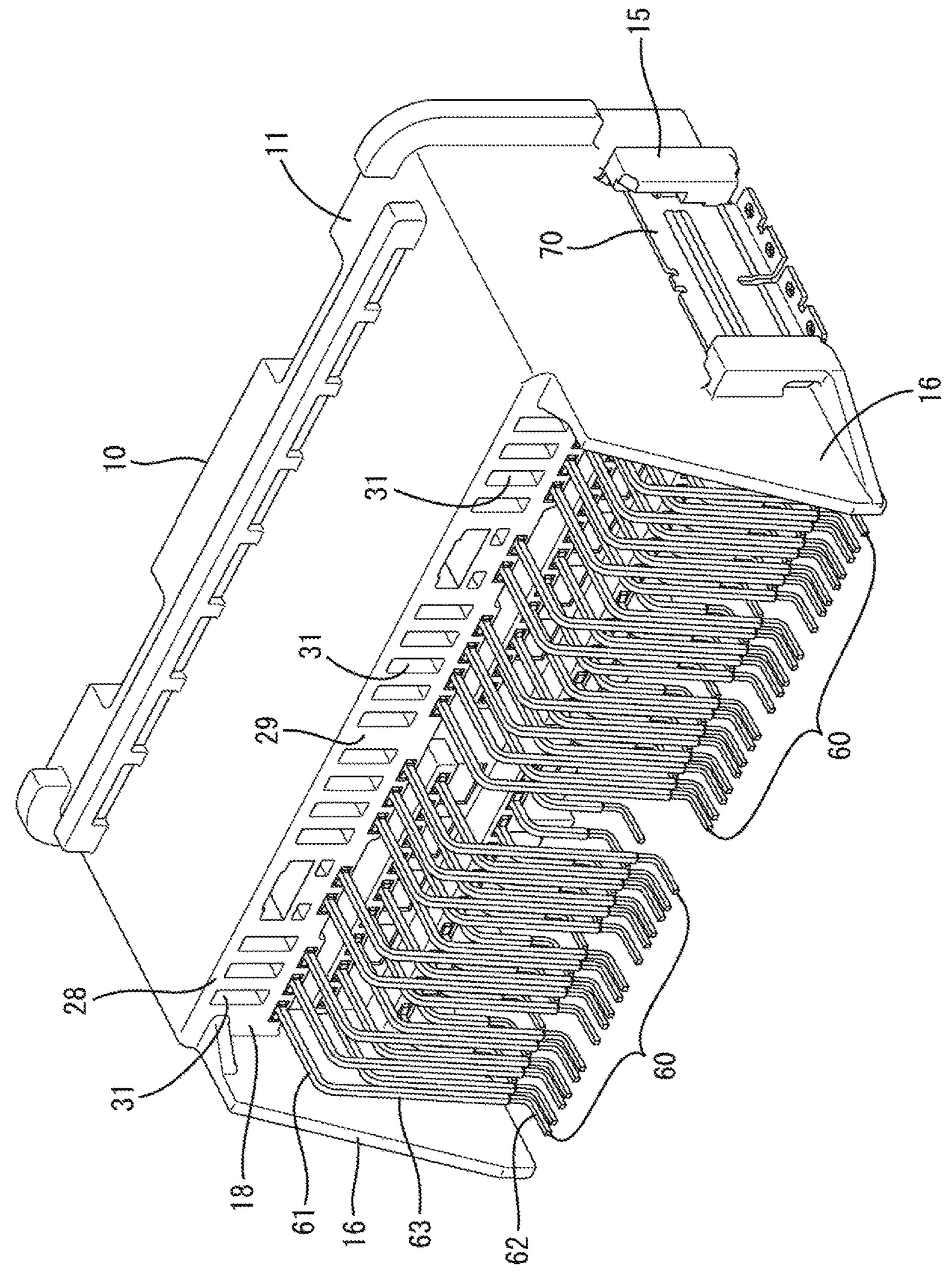
FIG. 1 is a perspective view of a board connector according to one embodiment of the invention.
Figure 4:
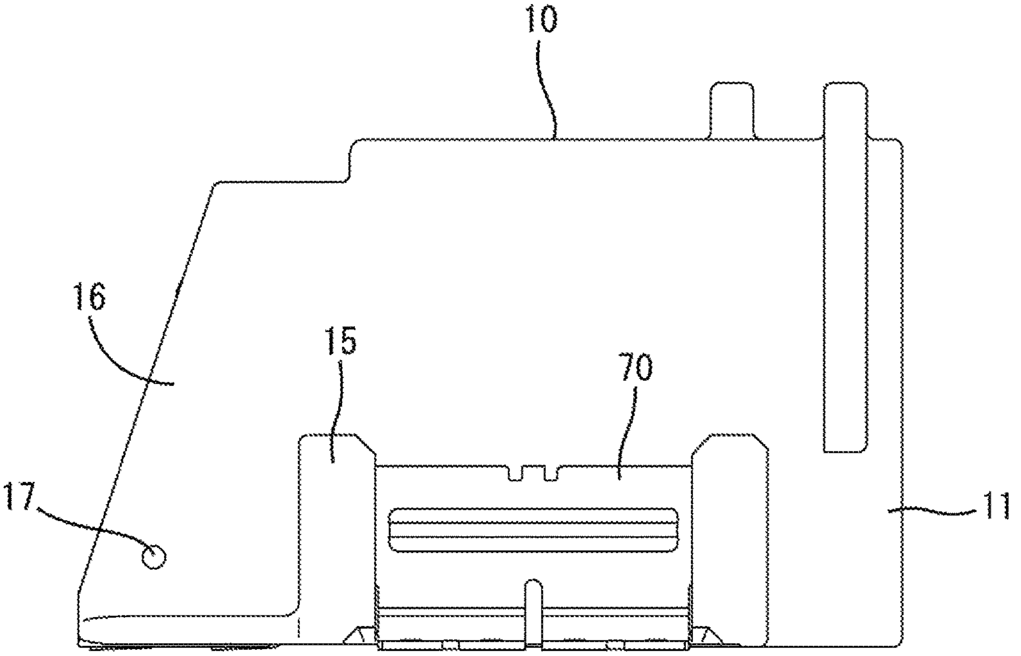
FIG. 4 is a side view of the board connector.

Fixture mounting portions 15 are provided on left and right outer side surfaces of the receptacle 11. As shown in FIGS. 1 and 4, each fixture mounting portion 15 holds a fixture 70 received from above. The fixtures 70 are plates made of metal, and lower end parts thereof are arranged along the surface of the circuit board 90 and fixed to the surface of the circuit board 90 by reflow soldering with the fixtures 70 respectively held in the fixture mounting portions 15. The housing 10 is fixed to the circuit board 90 via the fixtures 70.

Side walls 16 project rearward on both widthwise ends of the receptacle 11. Each side wall 16 is a trapezoidal or triangular plate extending vertically, and provided from a position near the upper end of the receptacle 11 to the lower end of the receptacle 11. One of the side walls 16 includes a resin pouring portion 17 that is circular in a side view and that is at a position near the lower end of an outer side surface as shown in FIG. 4. The resin pouring portion 17 is left by removing a resin gate 100, as shown in FIG. 5.

A back of the receptacle 11 has a wall 18 rising in the vertical direction, which is a direction intersecting the surface of the circuit board 90. The front surface of the wall 18 is facing the fitting spaces 13 in the receptacle 11 and the rear surface thereof is exposed on a back surface of the receptacle 11. As shown in FIG. 5, terminal mounting holes 19 penetrate through the wall 18 and the terminal fittings 60 are inserted therethrough. The terminal mounting holes 19 are arranged in the width direction in three stages in the vertical direction. The terminal mounting holes 19 have substantially rectangular cross-sections and are formed such that opening parts, from which the terminal fittings 60 are pulled out, are shifted in the width direction between the respective vertical stages. Thus, as shown in FIG. 2, the respective terminal fittings 60 are pulled out rearward from the respective terminal mounting holes 19 without interfering with each other.

Figure 2:
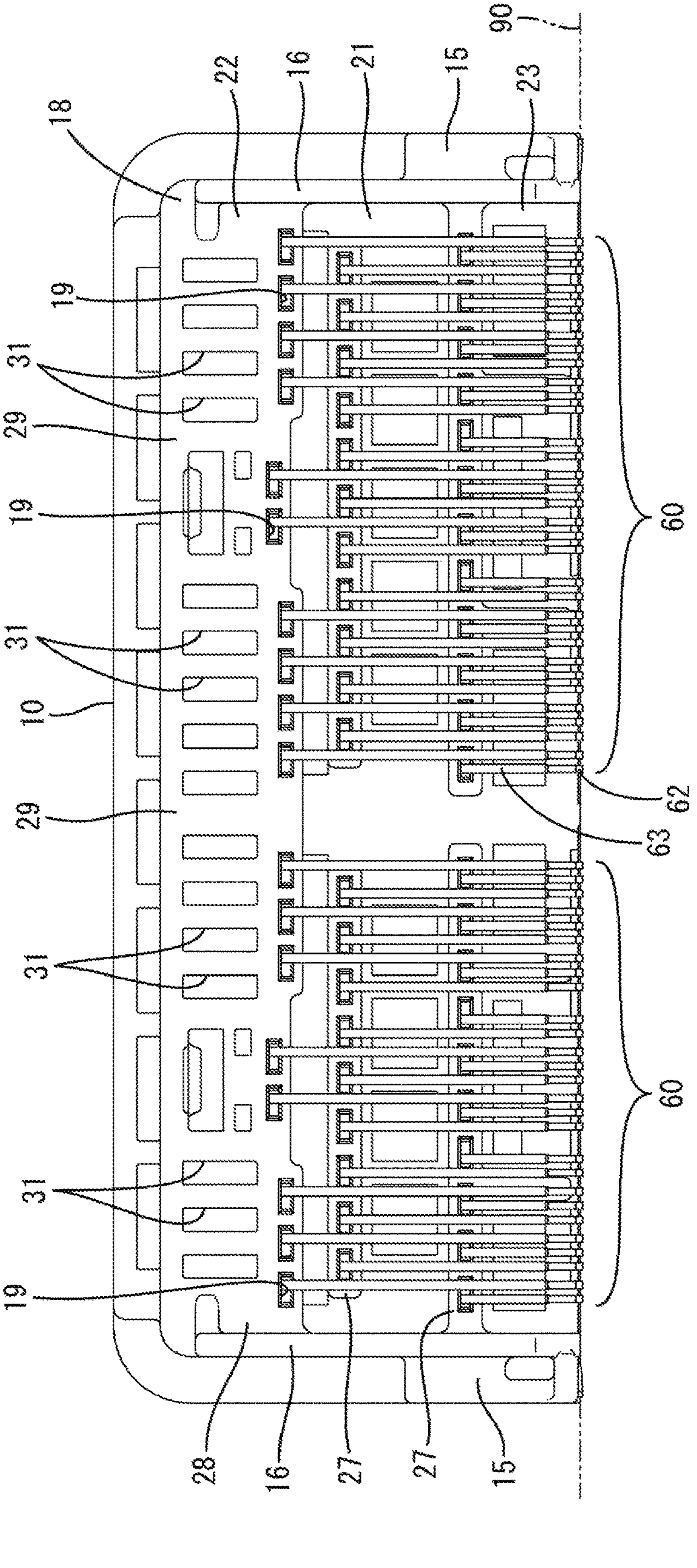
FIG. 2 is a back view of the board connector.
Figure 5:
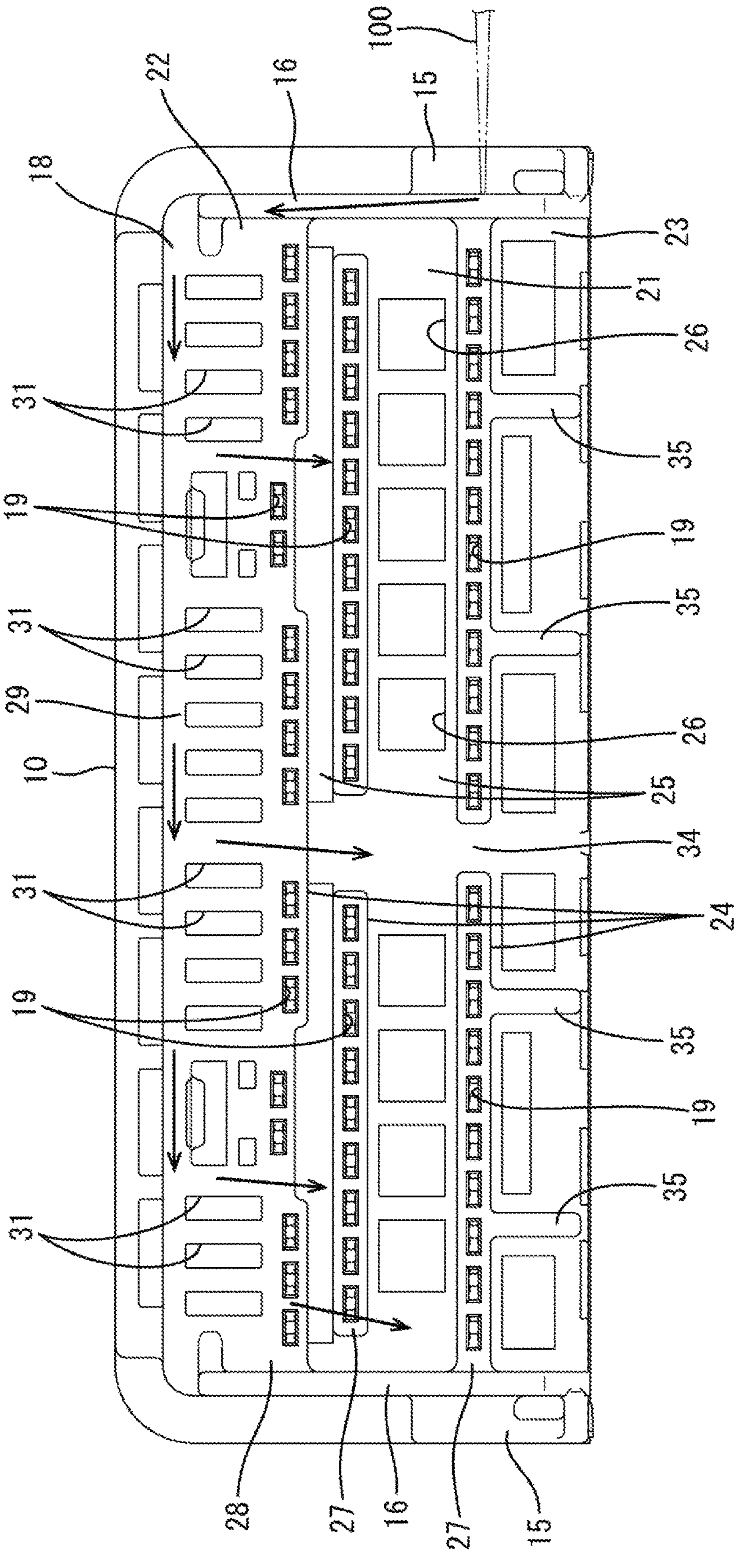
FIG. 5 is a back view of a housing.

As shown in FIGS. 2 and 5, the wall 18 has a terminal mounting region 21 where the terminal mounting holes 19 are arranged, a distant region 22 located on an upper side distant from the circuit board 90, and a near region 23 located on the lower side near the circuit board 90.

As shown in FIG. 5, the wall 18 also includes mounting walls 24 in vertical stages to collectively partition the respective terminal mounting holes 19 arranged in the width direction, and intermediate walls 25 having a smaller thickness in the front-rear direction than the mounting walls 24 between vertically adjacent mounting walls 24. The intermediate wall 25 located between the mounting walls 24 in the middle and lower stages have a larger vertical dimension than the intermediate wall 25 located between the mounting walls 24 in the upper and middle stages. Rectangular recesses 26 are formed in the rear surface at intervals in the width direction.

The mounting walls 24 include protrusions 27, 28 projecting farther rearward than the intermediate walls 25. The protrusions in the mounting walls 24 in the middle and lower stages are flat protrusions 27 extending in the width direction. Each flat protrusion 27 is divided in the width direction via a dividing portion 34 located on a side opposite to the separation wall 12.

The wall 18 further includes vertical ribs 35 extending in the vertical direction on the rear surface of the near region 23. The vertical ribs 35 are provided at intervals in the width direction and the upper ends thereof integrally intersect and are coupled to the flat protrusion 27 in the lower stage.

The protrusion in the mounting wall 24 in the upper stage is a height increased protrusion 28 continuous over the entire length in the width direction and having a larger vertical dimension than the flat protrusions 27. The increased height protrusion 28 has a height increased upward and is arranged from the terminal mounting region 21 to the distant region 22.

The rear surface of the increased height protrusion 28 is a flat continuous surface 29 continuous in the width direction and the vertical direction. The terminal mounting holes 19 in the upper stage arranged in a row in the width direction are open in the continuous surface 29 of the increased height protrusion 28, and a recesses 31 arranged in a row in the width direction (direction substantially parallel to the surface of the circuit board 90) are open above opening positions of the respective terminal mounting holes 19 in the upper stage in the continuous surface 29 of the increased height protrusion 28.

The recesses 31 have the same shape and the same height. Each recess 31 has an elongated shape whose longitudinal direction is the vertical direction (direction intersecting the surface of the circuit board 90) and includes an opening having a rectangular cross-section. The recesses 31 have parts partially overlapping the respective terminal mounting holes 19 in the upper stage in the width direction and are arranged to be located between the openings of adjacent terminal mounting holes 19 in the upper stage in the width direction. The respective recesses 31 are at the same positions in the width direction as the opening positions of the respective terminal mounting holes 19 in the middle stage except two recesses 31 located in a widthwise central part. Note that the respective recesses 31 can exhibit an effect of preventing the sink of the wall 18.

The terminal fitting 60 is made of conductive metal, in the form of a pin having a rectangular cross-section and includes, as shown in FIG. 1, a terminal connecting portion 61 arranged in the front-rear direction, a board connecting portion 62 located below the terminal connecting portion 61 and arranged substantially in the front-rear direction and a relay portion 63 linking the rear end of the terminal connecting portion 61 and the front end of the board connecting portion 62. A front end of the terminal connecting portion 61 projects into the receptacle 11 and is connected to a mating terminal mounted in the unillustrated mating housing fit into the receptacle 11. The board connecting portion 62 is connected to an unillustrated conductive portion on the surface of the circuit board 90 by reflow soldering. In each terminal fitting 60, a part (rear side of the terminal connecting portion 61, relay portion 63 and board connecting portion 62) pulled out rearward from the terminal mounting hole 19 is protected by having both sides in the width direction covered by the side walls 16.

Next, a method for manufacturing the housing 10 of the board connector and functions and effects of the board connector are described.

Molten resin is poured into a molding space (cavity) of the unillustrated mold for molding the housing 10 from the resin gate 100 schematically shown in FIG. 5. Here, a tip part of the resin gate 100 is arranged at a position corresponding to the resin pouring portion 17. The molten resin injected from the resin gate 100 can construct a filling path (see arrow directions of FIG. 5) to flow into the distant region 22 after flowing through plate-like spaces of the mold for molding the side walls 16 and further flow to the near region 23 by way of the terminal mounting region 21 from the distant region 22.

The distant region 22 is thick in the vertical direction and the front-rear direction by including the increased height protrusion 28. Thus, the molten resin easily flows into a space for molding the distant region 22. Further, the recesses 31 open in the continuous surface 29 of the increased height protrusion 28 are arranged such that the longitudinal direction thereof is aligned with the vertical direction. Thus, the molten resin having flowed into the space for molding the distant region 22 easily flows toward the near region 23 on the lower side along the longitudinal direction of the respective recesses 31.

The molten resin contains the fibrous filler 80. Thus, by the downward flow of the molten resin from the distant region 22 to the near region 23 along the filling path, the fibrous filler 80 is oriented such that a longitudinal direction thereof is aligned vertically. When the molten resin is demolded after being cooled and cured, the housing 10 is obtained as a molded article. The fibrous filler 80 is maintained in a vertically oriented state in the wall 18 of the housing 10.

Subsequently, the terminal fitting 60 is press-fit and mounted into each terminal mounting hole 19 of the housing 10. A press-fit margin of the terminal fitting 60 is increased by the protrusion 27, 28 of the wall 18. Further, the fixtures 70 are mounted into the fixture mounting portions 15 of the housing 10.

Subsequently, the housing 10 is placed on the surface of the circuit board 90 so that the board connecting portions 62 of the respective terminal fittings 60 are arranged along the conductive portions of the circuit board 90, and the fixtures 70 are arranged in predetermined paste solder parts on the surface of the circuit board 90. In that state, a reflow is performed to solder the board connecting portions 62 of the respective terminal fittings 60 to the conductive portions and to solder the fixtures 70 to the paste solder parts.

The housing 10 may expand due to heat during the reflow. However, the housing 10 contains the fibrous filler 80 and the fibrous filler 80 has a property of being hard to expand in the longitudinal direction and easy to expand in a transverse direction. As described above, the fibrous filler 80 is oriented such that the longitudinal direction is aligned with the vertical direction and the transverse direction is aligned with the width direction in the wall 18 of the housing 10. Thus, the housing 10 is structurally hard to expand, i.e. hard to curve in the width direction, which is the transverse direction of the fibrous filler 80.

If the housing 10 is curved in the width direction, a widthwise central side of the housing 10 may lift from the surface of the circuit board 90 and the board connecting portions 62 of the respective terminal fittings 60 mounted in the widthwise central side of the housing 10 may separate from the conductive portions and not properly connected. However, in this embodiment, the housing 10 is structurally hard to curve due to the vertical orientation of the fibrous filler 80, thereby preventing separation of the respective terminal fittings 60 from the corresponding conductive portions.

As described above, the fibrous filler 80 contained in the resin constituting the housing 10 is oriented vertically and parallel to the longitudinal direction of each recess 31. Thus, the housing 10 is hard to curve in the width direction perpendicular to the vertical direction under a heated environment such as during reflow heating and the separation of the board connecting portions 62 of the respective terminal fittings 60 from the conductive portions of the circuit board 90 is prevented. As a result, a good connected state of the terminal fittings 60 and the circuit board 90 is ensured and a proper mounted state is realized.

The mounting walls 24 are provided in stages on the wall 18 of the housing 10. The mounting wall 24 in the upper stage are in the distant region 22 and includes the increased height protrusion 28, and the rear surface of the increased height protrusion 28 has the flat continuous surface 29 in which the respective recesses 31 are open in addition to the respective terminal mounting holes 19 in the upper stage. Thus, the mounting wall 24 in the upper stage is formed to have large dimensions in the vertical direction and the front-rear direction and the molten resin easily flows into the distant region 22. As a result, the fibrous filler 80 is oriented reliably in the vertical direction, and the curved deformation of the housing 10 under a heated environment is suppressed more effectively.

Other embodiments are described briefly.

The respective recesses may be provided in the near region in addition to the distant region in the wall portion of the housing.

The terminal fittings may be mounted in the terminal mounting holes of the housing by insert molding.

The invention is applicable also when the board connecting portions of the terminal fittings are inserted into through holes of the circuit board and soldered.

LIST OF REFERENCE SIGNS

10 . . . housing
16 . . . side wall
17 . . . resin pouring portion
18 . . . wall
19 . . . terminal mounting hole
21 . . . terminal mounting region

22 . . . distant region
23 . . . near region
24 . . . mounting wall
25 . . . intermediate wall
31 . . . recess
60 . . . terminal fitting
62 . . . board connecting portion
80 . . . fibrous filler
90 . . . circuit board
100 resin gate

What is claimed is:

1. A board connector, comprising:

terminal fittings including board connecting portions to be connected to a circuit board; and a housing made of synthetic resin containing a fibrous filler, the housing having a bottom end configured for mounting on the circuit board, a top end opposite the bottom end and a wall rising in a height direction from the bottom end toward the top end of the housing, the wall having a terminal mounting region spaced from the top and bottom ends, and the terminal fittings being mounted in the terminal mounting region;

the wall further having a distant region between the terminal mounting region and the top end of the housing, the distant region of the wall being provided with recesses having an elongated shape defining a longitudinal direction aligned with the height direction, the recesses being arranged side by side in a transverse direction perpendicular to the height direction, the recesses being spaced below a top end of the wall and spaced above the terminal mounting region.

2. A board connector, comprising:

terminal fittings including board connecting portions to be connected to a circuit board; and a housing made of synthetic resin containing a fibrous filler, disposed on the circuit board and including a wall rising in a direction intersecting the surface of the circuit board and provided with a terminal mounting region, the terminal fittings being mounted in the terminal mounting region;

the wall being provided with recesses having an elongated shape defining a longitudinal direction aligned with the direction intersecting a surface of the circuit board and arranged side by side in a transverse direction perpendicular to the longitudinal direction at least in a distant region located on a side of the terminal mounting region distant from the circuit board, wherein the housing includes a plate-like side wall projecting in a direction intersecting a wall surface of the wall and configured to cover exposed parts of the terminal fittings pulled out from the terminal mounting region, and a resin pouring portion left by removing a resin gate is provided in a wall surface of the side wall.

3. The board connector of claim 2, wherein:

the terminal mounting region includes terminal mounting holes in the longitudinal direction and the transverse direction of the recesses, a plurality of the terminal mounting holes being arranged in a transverse direction of the recesses being divided by mounting walls;

the mounting walls being arranged in stages in the longitudinal direction of the recesses, thicker than intermediate walls located between the mounting walls in the respective stages in the longitudinal direction and include parts projecting toward openings of the recesses; and the mounting wall arranged in the distant region includes a flat continuous surface in which the recesses are defined and both the plurality of terminal mounting holes and the plurality of recesses are open.

4. A method for manufacturing the housing of the board connector of claim 2, wherein the resin gate is arranged at a position corresponding to the resin pouring portion, molten resin is injected into a molding space of a mold from the resin gate, and the housing is molded to include a filling path in which the molten resin successively flows in spaces of the molding space respectively corresponding to the side wall, the distant region, the terminal mounting region and the near region.

5. The board connector of claim 1, wherein the fibrous filler of the housing comprises fibers contained in the synthetic resin, the fibers being aligned in the height direction at least in positions below the top ends of the recesses.

6. The board connector of claim 1, wherein each of the recesses aligns at least partly in the height direction with at least one of the terminal fittings in the wall of the housing.

* * * * *